United States Patent [19]
Yamashita et al.

[11] Patent Number: 4,963,405
[45] Date of Patent: Oct. 16, 1990

[54] TAPE FOR ENCASING ELECTRONIC PARTS

[75] Inventors: Shunsuke Yamashita; Norihito Kondoh, both of St. Paul, Minn.

[73] Assignee: Minnesota Mining and Manufacturing Company, St. Paul, Minn.

[21] Appl. No.: 383,037

[22] Filed: Jul. 20, 1989

[30] Foreign Application Priority Data

Aug. 12, 1988 [JP] Japan .................. 63-201494

[51] Int. Cl.⁵ .................. B65D 73/02; C09J 7/02
[52] U.S. Cl. .................. 428/40; 428/42;
428/202; 428/343; 428/344; 428/346; 428/347;
428/349; 428/351; 428/352; 428/354; 428/355;
428/901; 428/906; 428/522; 428/475.8;
428/476.1; 428/76; 206/328; 206/330
[58] Field of Search .................. 206/328, 330; 428/40,
428/42, 202, 343, 344, 346, 347, 349, 351, 352,
354, 355, 901, 906, 522, 475.8, 476.1, 76

[56] References Cited

U.S. PATENT DOCUMENTS

| | | | |
|---|---|---|---|
| 3,595,740 | 7/1971 | Gerow | 428/349 |
| 4,125,739 | 11/1978 | Bow | 428/40 X |
| 4,724,958 | 2/1988 | Kaneko et al. | 206/334 X |

FOREIGN PATENT DOCUMENTS

| | | | |
|---|---|---|---|
| 0102331 | 3/1984 | European Pat. Off. | 428/40 |
| 2182264 | 5/1987 | United Kingdom | 428/40 |

Primary Examiner—Ellis P. Robinson
Assistant Examiner—William P. Watkins, III
Attorney, Agent, or Firm—Donald M. Sell; Walter N. Kirn; David L. Weinstein

[57] ABSTRACT

Tape for encasing electronic parts comprising a carrier tape having a plurality of recesses for encasing electronic parts and a plurality of guide perforations, and a cover tape pasted onto said carrier tape with an adhesive so as to seal only said recesses while leaving said guide perforations open.

3 Claims, 1 Drawing Sheet

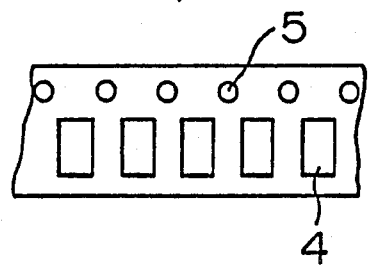
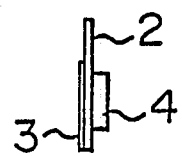
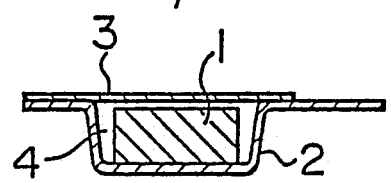

TAPE FOR ENCASING ELECTRONIC PARTS

BACKGROUND OF THE INVENTION

1. Field of the Invention

The present invention relates to a tape for encasing chip-form electronic parts. More particularly, the invention relates to a tape for encasing electronic parts wherein a cover tape can be peeled from a carrier tape smoothly and automatic mounting of the chip-form electronic parts can be practiced with high efficiency.

2. Discussion of the Art

A tape for encasing electronic parts comprising a carrier tape and a cover tape pasted thereon that is suitable for so-called automatic mounting work, i.e., automatically incorporating chip-form electronic parts into the base of a printed circuit board, is disclosed in Japanese Patent Application Kokai (Laid-Open) No. 60-63995. That application discloses a tape for encasing chip-form electronic parts comprising a tape-form body (carrier tape) having a plurality of through-holes for encasing electronic parts (recesses for encasing electronic parts) and a plurality of guide perforations, a cover sheet (cover tape), and electronic parts encased in each of the recesses.

Previously in tapes for encasing electronic parts, a film made of polyester resin, such as polyethylene terephthalate (PET), was used as the cover tape. In a tape for encasing electronic parts wherein the PET film is pasted onto a carrier tape with an adhesive, the peeling of the cover tape could not be effected smoothly because the uniformity of the peeling adhesivity of the cover tape pasted onto the carrier tape was difficult to control. That is, the carrier tape was often subjected to unnecessary vibration during automatic mounting of electronic parts or during incorporation of the electronic parts into electronic instruments one by one while the cover tape was being peeled off. As a result, the electronic parts could not be incorporated exactly into the desired positions, and electronic parts ran out of the recess, and in some extreme cases, were lost.

SUMMARY OF THE INVENTION

This invention provides a tape for encasing electronic parts comprising a carrier tape having a plurality of recesses for encasing electronic parts and a plurality of guide perforations, and a cover tape pasted onto said carrier tape with an adhesive so as to seal only said recesses while leaving said guide perforations open.

The cover tape is a nylon-based resin sheet and the adhesive is an ethylene-vinyl acetate copolymer-based adhesive. The use of nylon for the cover tape allow the cover tape to be pulled smoothly from a carrier tape during automatic, e.g., robotic, assembly of circuit boards.

The present invention provides a tape for encasing electronic parts wherein the cover tape can be peeled off from the carrier tape smoothly at the time of automatic mounting of electronic parts, electronic parts can be incorporated exactly, and the running-out of electronic parts from the recess and their ensuing loss can be prevented.

BRIEF DESCRIPTION OF THE DRAWINGS

FIGS. 1(a) and (b) are a plan view and a side view, respectively, of the tape of the invention for encasing electronic parts.

FIG. 2 is a sectional view of the tape of the invention for encasing electronic parts.

DETAILED DESCRIPTIONS

According to the present invention, there is provided a tape for encasing electronic parts comprising a carrier tape 2 having a plurality of recesses 4 for encasing electronic parts and a plurality of guide perforations 5, and a cover tape 3 pasted onto carrier tape 2 with an adhesive so as to seal only recesses 4 for electronic parts while leaving guide perforations 5 open. Cover tape 3 is a nylon-based resin sheet and the adhesive is an ethylene-vinyl acetate copolymer-based adhesive. The peeling adhesivity between carrier tape 2 and cover tape 3 is in a range of not more than 70 gf (g/0.6 mm width) and not less than 10 gf (g/0.6 mm width) both at the initial stage and after heat aging at 60° C. for 24 hours, and the difference between maximum peeling adhesivity and minimum peeling adhesivity is not more than 35 gf (g/0.6 mm width). Thus, it has been discovered that a combination of a nylon-based sheet as a cover tape and an adhesive layer composed mainly of ethylene-vinyl acetate copolymer (EVA) can provide a cover tape and a tape for encasing electronic parts having a uniform and appropriate peeling adhesivity.

Examples of materials suitable for the nylon-based resin sheet usable as the cover tape of the invention include films and sheets of nylon 6, nylon 66, nylon 610, nylon 11, and their copolymers.

In the ethylene-vinyl acetate copolymer-based adhesive suitable for this invention, the ratio of ethylene content to vinyl acetate content should preferably be 70 to 95% by weight (ethylene)/5 to 30% by weight (vinyl acetate), based on peeling adhesivity at the initial stage and after heat aging and based on production of tape.

The tape for encasing electronic parts of this invention can be produced by heating and contact-bonding a carrier tape 2, formed from a known elementary material, such as paper, aluminum, or thermoplastic resin, and having a plurality of recesses for encasing electronic parts and a plurality of guide perforations, onto a cover tape 3, made of a nylon-based resin sheet, by means of an ethylene-vinyl acetate copolymer-based adhesive, so as to seal only the recesses 4 for encasing electronic parts.

In the tape for encasing electronic parts of this invention, the maximum and minimum values of peeling adhesivity between carrier tape 2 and cover tape 3 at the initial stage and after heat aging at 60° C. for 24 hours should preferably be in a specified range from a practical point of view. That is, from the viewpoint of preventing an increase in load of an automatic mounting machine and preventing vibration at the time of peeling, the maximum value of peeling adhesivity at the initial stage and after heat aging should preferably not exceed 70 gf (g/0.6 mm width). From the viewpoint of ensuring the reliability of adhesion between carrier tape 2 and cover tape 3 and ensuring the reliability of mounting, the minimum value of peeling adhesivity at the initial stage and after heat aging should preferably not be smaller than 10 gf (g/0.6 mm width). Further, from the viewpoint of achieving smooth peeling of cover tape under a uniform peeling force, the difference between the peeling adhesivity at the initial stage and after heat aging should be as small as possible, preferably not greater than 35 gf (g/0.6 mm width).

The invention will be explained in more detail by way of the following examples, but it is to be understood that the invention is by no means limited by these examples.

In the examples and comparative examples, "%" means "% by weight".

EXAMPLES 1 to 5 and COMPARATIVE EXAMPLES 1 to 5

A tape for encasing electronic parts was prepared by coating a plastic carrier tape, which had been processed so as to have a plurality of recesses for encasing electronic parts and a plurality of guide perforations, with an ethylene-vinyl acetate (EVA) copolymer-based adhesive having varying compositions as shown in Table 1, up to a thickness of 25 microns, and then heating it and contact-bonding thereonto a cover tape having a thickness of 15 microns at a prescribed contact bonding temperature.

"Peeling adhesivity at the initial stage", i.e., peeling adhesivity between the carrier tape and the cover tape of the tape for encasing electronic parts at ordinary temperature (23° C.), and "peeling adhesivity after heat aging", i.e., peeling adhesivity between the carrier tape and the cover tape at ordinary temperature after being kept at 60° C. for 24 hours, were measured by means of constant speed tensile tester. Further, the tape for encasing electronic parts was tested for heat resistance performance at its contact bonding temperature and for anti-static effect after an anti-static treatment. The results are summarized in Table 1.

tapes of Examples 1 to 5 showed 40% fewer defects than those of Comparative Examples 1 to 5.

As has been mentioned above, the tape of this invention for encasing electronic parts exhibits uniform and appropriate peeling adhesivity between the carrier tape and the cover tape under practical conditions. Accordingly, at the time of automatic mounting of electronic parts, the carrier tape can be smoothly peeled off from the cover tape. Thus, the tape of the invention for encasing electronic parts enables an exact incorporation of electronic parts at the time of their automatic mounting, and at the same time, the running-out of electronic parts from the recesses and their ensuing loss can be prevented, thereby enabling a great improvement in the efficiency of automatic mounting work of electronic parts.

What is claimed is:

1. A tape for encasing electronic parts, comprising a carrier tape made from a material selected from the group consisting of paper, aluminum, and thermoplastic resin and having a plurality of recesses for encasing electronic parts and a plurality of guide perforations, said carrier tape having a cover tape pasted thereon with an adhesive in such a way as to seal only the recesses for electronic parts, while leaving the guide perforations open, said cover tape being a nylon-based resin sheet and said adhesive being an ethylene-vinyl acetate copolymer-based adhesive, the peeling adhesivity between the carrier tape and the cover tape being in a range of not more than 70 gf (g/0.6 mm width) and not

TABLE I

| Example | Comparative Example | Elementary material of cover tape | EVA-based adhesive | | Contact bonding temperature (°C.) | Peeling adhesivity at initial stage (gf) | | | |
|---|---|---|---|---|---|---|---|---|---|
| | | | Vinyl acetate content (%) | Softening temperature (°C.) | | Maximum | Minimum | Mean value | Maximum-minimum |
| 1 | 1 | PET | 20 | 54 | 120 | 62 | 26 | 48 | 36 |
| | | Nylon 6 | 20 | 54 | 120 | 50 | 28 | 46 | 22 |
| 2 | 2 | PET | 16 | 62 | 120 | 54 | 18 | 36 | 36 |
| | | Nylon 6 | 16 | 62 | 120 | 50 | 23 | 39 | 27 |
| 3 | 3 | PET | 14 | 66 | 120 | 53 | 17 | 33 | 36 |
| | | Nylon 6 | 14 | 66 | 120 | 42 | 22 | 32 | 20 |
| 4 | 4 | PET | 12 | 70 | 120 | 45 | 22 | 33 | 23 |
| | | Nylon 6 | 12 | 70 | 120 | 38 | 20 | 28 | 18 |
| 5 | 5 | PET | 10 | 73 | 130 | 26 | 11 | 15 | 15 |
| | | Nylon 6 | 10 | 73 | 130 | 24 | 15 | 19 | 9 |

| Example | Comparative Example | Peeling adhesivity after heat aging (gf) | | | | Heat resistance performance | Anti-static effect |
|---|---|---|---|---|---|---|---|
| | | Maximum | Minimum | Mean value | Maximum-minimum | | |
| 1 | 1 | 78 | 38 | 62 | 40 | Good | Good |
| | | 54 | 26 | 38 | 28 | Good | Good |
| 2 | 2 | 74 | 33 | 60 | 41 | Good | Good |
| | | 53 | 29 | 37 | 24 | Good | Good |
| 3 | 3 | 72 | 27 | 54 | 45 | Good | Good |
| | | 49 | 17 | 34 | 32 | Good | Good |
| 4 | 4 | 50 | 8 | 30 | 42 | Good | Good |
| | | 42 | 18 | 27 | 24 | Good | Good |
| 5 | 5 | 28 | 6 | 18 | 22 | Good | Good |
| | | 24 | 13 | 19 | 11 | Good | Good |

As shown in Table 1, when PET is used as the elementary material of the cover tape, either the maximum value of peeling adhesivity after heat aging exceeds 70 gf (g/0.6 mm width) or its minimum value is less than 10 gf (g/0.6 mm width), and the difference between the maximum and the minimum is great, regardless of the composition of EVA-based adhesive. On the other hand, when nylon 6 is used as the elementary material of the cover tape, peeling adhesivity at both the initial stage and after heat aging are in the range of 70 to 10 gf (g/0.6 mm width), and the difference between the maximum and the minimum is small.

Next, the tapes for encasing electronic parts of Examples 1 to 5 and Comparative Examples 1 to 5 were subjected to a practical electronic parts-encasing test. The less than 10 gf (g/0.6 mm width) both at the initial stage and after heat aging at 60° C. for 24 hours, and the difference between maximum peeling adhesivity and minimum peeling adhesivity being not more than 35 gf (g/0.6 mm width).

2. A tape according to claim 1, wherein said cover tape is made of a member selected from the group consisting of nylon 6, nylon 66, nylon 610, nylon 11, and copolymers of the foregoing nylon polymers.

3. A tape according to claim 1, wherein said ethylene-vinyl acetate copolymer-based adhesive comprises 70 to 95% by weight ethylene and 5 to 30% by weight vinyl acetate.

* * * * *